United States Patent [19]

Suzuki

[11] Patent Number: 4,709,251

[45] Date of Patent: Nov. 24, 1987

[54] DOUBLE SCHOTTKY-GATE FIELD EFFECT TRANSISTOR

[75] Inventor: Tomihiro Suzuki, Osaka, Japan

[73] Assignee: Sumitomo Electric Industries, Ltd., Japan

[21] Appl. No.: 768,486

[22] Filed: Aug. 21, 1985

[30] Foreign Application Priority Data

Aug. 27, 1984 [JP] Japan ................................ 59-178013

[51] Int. Cl.$^4$ ........................................... H01L 29/80
[52] U.S. Cl. ....................................... 357/22; 357/15; 357/55; 357/90
[58] Field of Search ................ 357/15, 22, 22 R, 22 J, 357/22 K, 22 L, 22 G, 22 P, 22 S, 22 R, 55, 90, 15 P, 15 M, 22 I

[56] References Cited

U.S. PATENT DOCUMENTS

| | | | |
|---|---|---|---|
| 2,967,985 | 1/1961 | Shockley et al. | 357/22 R |
| 4,160,259 | 7/1979 | Nishizawa | 357/22 I |
| 4,163,984 | 8/1979 | Pucel | 357/90 X |
| 4,537,654 | 8/1985 | Berenz et al. | 357/22 K |

FOREIGN PATENT DOCUMENTS

| | | | |
|---|---|---|---|
| 46-32698 | 9/1971 | Japan | 357/22 S |
| 54-148384 | 11/1979 | Japan | 357/22 S |
| 54-148385 | 11/1979 | Japan | 357/22 |
| 57-207379 | 12/1982 | Japan | 357/22 S |
| 58-95870 | 6/1983 | Japan | 357/22 G |

*Primary Examiner*—Martin H. Edlow
*Assistant Examiner*—William A. Mintel
*Attorney, Agent, or Firm*—Kenyon & Kenyon

[57] ABSTRACT

A Schottky-gate field effect transistor comprises a semi-insulative semiconductor substrate, an active layer formed on one surface of the substrate, a source electrode and a drain electrode on the active layer in ohmic contact thereto, respectively, a first Schottky gate electrode on the active layer between the source and drain electrodes, and a second Schottky gate electrode on the active layer between the drain electrode and the first gate electrode. A portion of the active layer underneath the second gate electrode has a sheet resistance smaller than that of the active layer portion underneath the first gate electrode. The source electrode and the second electrode is electrically interconnected by connection means formed on the substrate.

10 Claims, 9 Drawing Figures

DOUBLE SCHOTTKY-GATE FIELD EFFECT TRANSISTOR

BACKGROUND OF THE INVENTION

1. Field of the Invention

The present invention relates to a field effect transistor, and more particularly to a Schottky-gate field effect transistor capable of operating at a high speed and in a high frequency band.

2. Description of Related Art

At present, Schottky-gate field effect transistors, i.e., metal semiconductor field effect transistors (abbreviated as MESFETs hereinafter) have been widely used as microwave amplifiers and oscillators. Furthermore, the MESFETs have been used as fundamental elements for high speed digital integrated circuits.

Referring to FIG. 1, there is shown a conceptual construction of a basic MESFET. The shown MESFET includes a single-crystal substrate 1 of high-resistive or semi-insulative semiconductor material and an active layer 2 of conductive semiconductor crystal formed on the substrate 1. On the active layer 2 there are formed a drain electrode 3 and a source electrode 4 separately from each other an in ohmic contact to the active layer 2. In addition, a Schottky gate electrode 5 is deposited on the active layer 2 between the drain and source electrodes 3 and 4.

Such a MESFET has various parasitic capacitances between the electrodes, including the capacitance $C_{gd}$ formed between the drain 3 and the gate electrode 5, the capacitance $C_{gs}$ formed between the source 4 and the gate electrode 5, the capacitance $C_{ds}$ formed between the drain 3 and the source 4, etc. Among these parasitic capacitances, the gate-drain capacitance $C_{gd}$ has a substantial amount, compatible to the gate-source capacitance $C_{gs}$, specifically about one-third of the gate-source capacitance $C_{gs}$ in the case of GaAs-MESFETs. Because of this, the gate-drain capacitance $C_{ds}$ causes a significant problem explained hereinafter.

Turning to FIG. 2, there is shown an exemplary circuitry of a source follower amplifier using the MESFET as mentioned above. The shown amplifier comprises an MESFET 6 having a gate connected to an input and a source connected to an output and grounded through a resistor R. A drain of the MESFET 6 is connected to a positive voltage source $V_{cc}$. Also referring to FIG. 3, there is shown an example of a level shift circuit, which includes an MESFET 6 whose drain is connected to a positive voltage $V_{CC}$ and whose gate is connected to an input. A source of the MESFET 6 is connected through two diodes D1 and D2 to an output and a drain of another MESFET 7. A source of the MESFET 7 is connected to a biasing voltage $V_{EE}$, and also connected to a gate thereof so that the MESFET 7 constitutes an active load functioning as a constant current source. The two circuits shown in FIGS. 2 and 3 are not only used as discrete circuits but also widely used as unitary circuits assembled in integrated circuits.

In the aforementioned circuits, assuming that the current gain is $g_m$ and the input capacitance is $C_{in}$, the cutoff frequency $f_c$ is expressed as follows:

$$f_c = (g_m/C_{in})^n \text{ where } n=1\text{-}2 \quad (1)$$

In addition, the input capacitance $C_{in}$ is substantially equal to the gate-drain capacitance $C_{dg}$. Therefore, the capacitance $C_{dg}$ is one significant factor which determines the performance of these circuits.

Generally, the input capacitance $C_{in}$ of amplifying circuits includes the gate-source capacitance $C_{gs}$ and the gate-drain capacitance $C_{gd}$ which functions as a feedback capacitance. looking at this gate-drain capacitance $C_{gd}$ from the input of the circuit, the capacitance $C_{gd}$ is substantially multiplied by the voltage gain G because of the so-called Miller effect. Namely, the input capacitance $C_{in}$ is expressed as follows:

$$C_{in} = C_{gs} + (1-G) C_{gd} \quad (2)$$

Now recalling that the gate-drain capacitance $C_{gd}$ is about one-third of the gate-source capacitance $C_{gs}$, and considering that an ordinary GaAs-MESFET amplifier has a voltage gain G of at least 10 times, the input capacitance $C_{in}$ is substantially dominated by the feedback capacitance $(1-G)C_{gd}$, i.e., the gate-drain capacitance $C_{gd}$. As a result, the cutoff frequency $f_c$ is determined by the gate-drain capacitance $C_{gd}$, and therefore, has been limited to 1.2 GHz in the conventional GaAs-MESFET amplifier.

As seen from the above, in the circuits shown in FIGS. 2 and 3, the gain at high frequencies, the cutoff frequency, the input impedance, and the operation speed (in the case of logical circuit) are determined by the current gain and the gate-drain capacitance $C_{gd}$ of the MESFET used. Therefore, decrease in the gate-drain capacitance $C_{gd}$ of MESFETs is very important to improvement in the characteristics of the circuits.

For the purpose of reducng the gate-drain capacitance $C_{gd}$ of MESFETs, it is considered to use a dual-gate MESFET provided with an elaborate external circuit, as a single-gate MESFET having an equivalently small gate-drain capacitance $C_{gd}$.

Referring to FIG. 4, there is shown a conceptual structure of an exemplary dual-gate MESFET. The shown dual-gate MESFET comprises a substrate 1 and an active layer 2 formed thereon. A drain electrode 3 and a source electrode 4 are deposited on the active layer 2, and also, a pair of Schottky gate electrodes 8 and 9 are deposited on the active layer portion between the drain and source electrodes 3 and 4.

If the dual-gate MESFET is used as an amplifier, the Schottky gate electrode 8 adjacent to the drain electrode 3 is short-circuited to the source electrode 4 through an external circuit (not shown) and a signal is applied to only the Schottky gate electrode 9 adjacent to the source electrode 4.

With such connection, the capacitance between the Schottky gate electrode 9 and the drain electrode 3 is decreased to a few tenths or less of that of the conventional single-gate MESFET.

However, a new substantial problem will arise from parasitic inductances and capacitances attributable to the external circuit provided to the dual-gate MESFET. In addition, the conventional dual-gate MESFET has a current gain smaller than a single-gate MESFET and cannot be properly biased only with a simple connection between the source and the second gate adjacent to the drain, so that the aforementioned circuit of the dual-gate MESFET is difficult to provide good high speed operability and good gain at high frequencies.

SUMMARY OF THE INVENTION

Accordingly, it is an object of the present invention to provide a MESFET in which the aforementioned disadvantages have been eliminated.

Another object of the present invention is to provide an MESFET having a very small gate-drain capacitance and a sufficiently large current gain.

Still another object of the present invention is to provide such an MESFET which requires no external circuit.

A further object of the present invention is to provide such an MESFET which can be assembled in an integrated circuit without occupying a large area on the integrated circuit chip.

The above and other objects of the present invention are achieved in accordance with the present invention by a MESFET which comprises a semi-insulative semiconductor substrate; an active layer formed on one surface of the substrate; a source electrode and a drain electrode on the active layer in ohmic contact thereto, respectively; a first Schottky gate electrode on the active layer between the source and drain electrodes; and a second Schottky gate electrode on the active layer between the drain electrode and the first gate electrode, a portion of the active layer underneath the second gate electrode having a sheet resistance smaller than that of the active layer portion underneath the first gate electrode, and the source electrode and the second gate electrode being electrically interconnected by connection means formed on the substrate.

In one embodiment of the MESFET in accordance with the present invention, the active layer portion underneath the second gate electrode has an impurity concentration higher than that of the active layer portion underneath the first gate electrode. Specifically, the active layer portion underneath the first gate electrode is doped with impurities to have a threshold voltage of about 1.5 V and the active layer portion underneath the second gate electrode has a dose larger than that of the active layer portion underneath the first gate electrode by about 20%. Preferably, the active layer portion underneath the first gate electrode has a dosage of $3.9 \times 10^{12}/cm^2$ and the active layer portion underneath the second gate electrode has a dosage of $5.0 \times 10^{12}/cm^2$.

In another embodiment, the active layer portion underneath the first gate electrode has a thickness smaller than that of the active layer portion underneath the second gate electrode. Specifically, the active layer portion underneath the first gate electrode has a threshold voltage of about 1.5 V and the active layer portion underneath the second gate electrode is thicker than that of the active layer portion underneath the first gate electrode by about 20%.

The substrate and the active layer are made from III-V compound semiconductor material including GaAs, InP, InAs, InSb, etc. In the preferred embodiment, the substrate is made from GaAs and the active layer is doped with n-type impurities such as Se, S, Si, etc. In addition, the drain and source electrodes are formed of ohmic contact materials such as Au-Ge-Au, Au-Ge-Ni, Au-Ge-Pt, etc., and the Schottky gate electrodes are formed of material which has a large energy gap to the material of the active layer, such as Au-Ni, Ti-Pt-Au, Al, Pt, Pd, etc.

In the composite MESFET as mentioned above, the second gate electrode is connected to the source electrode, so that the MESFET functions as a single-gate MESFET. In addition, the electrical connection between the second gate electrode and the source electrode is realized by the internal connection means formed on the substrate, not by an external circuit. Therefore, the MESFET can have a small gate-drain capacitance for the reason explained hereinafter, without parasitic inductance and capacitance attributable to an external circuit.

Furthermore, since the sheet resistance of the active layer portion underneath the second gate electrode is smaller than that of the active layer portion underneath the first gate electrode, the MESFET portion constituted by the second gate electrode has a sufficient current capacity, i.e., a larger pinchoff voltage. Therefore, the composite MESFET can have a current gain compatible to a single-gate MESFET.

In addition, the second gate electrode can be properly biased by a mere direct connection to the source electrode, without an additional bias circuit, so that the composite MESFET can be assembled in an integrated circuit chip without dominating a substantial area.

The above and other objects, features and advantages of the present invention will be apparent from the following description of preferred embodiments of the invention with reference to the accompanying drawings.

DESCRIPTION OF THE PREFERRED EMBODIMENTS

Figure 1:
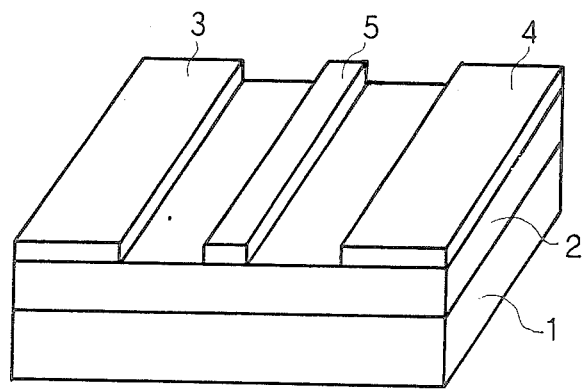
FIG. 1 is a schematic perspective view showing a conceptual structure of a conventional single-gate MESFET.
Figure 2:
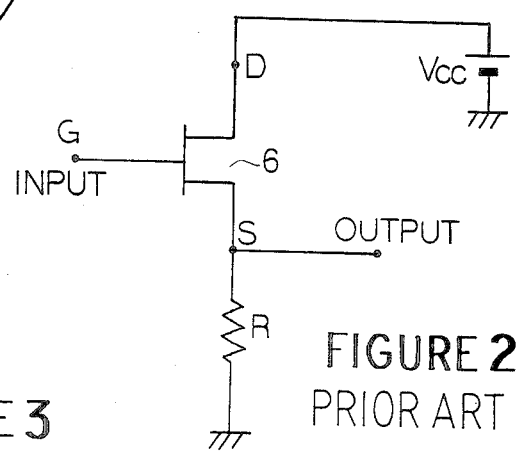
FIGS. 2 and 3 are circuit diagrams showings examples of circuits using MESFETs.
Figure 3:
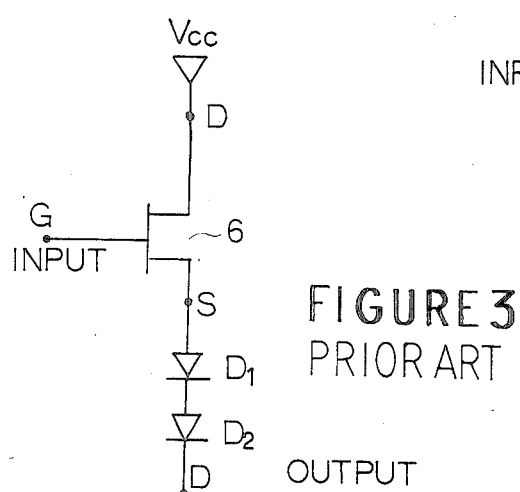
Figure 4:
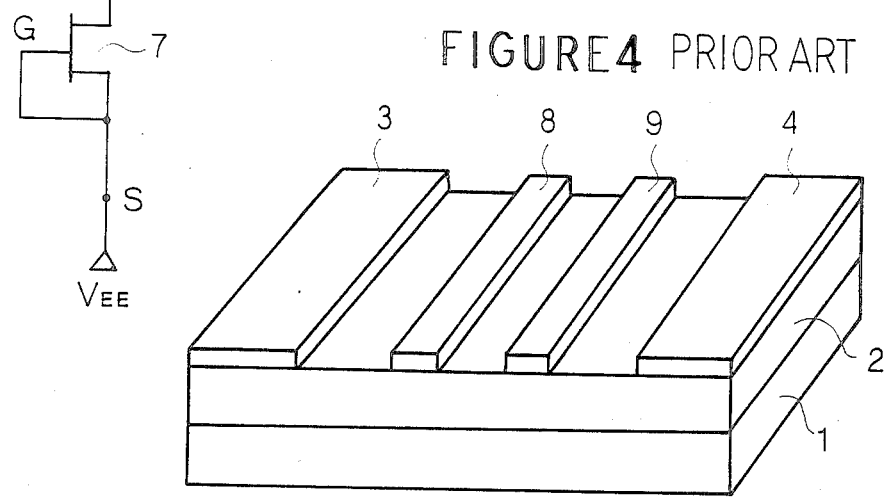
FIG. 4 is a view similar to FIG. 1 but showing a conventional dual-gate MESFET.
Figure 5:
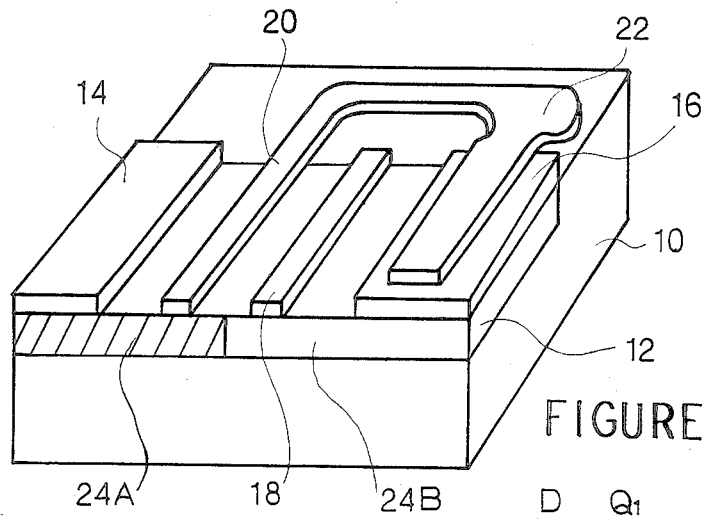
FIG. 5 is a view similar to FIG. 1 but showing a first embodiment of the MESFET constructed in accordance with the present invention.

Referring to FIG. 5, there is shown one embodiment of the MESFET constructed in accordance with the present invention. The MESFET shown comprises a substrate 10 of a high-resistive or semi-insulative semiconductor single-crystal, such as a non-doped GaAs single-crystal substrate. The substrate 10 has an active layer 12 formed thereon, which is composed of a conductive semiconductor single-crystal such as n-GaAs. On the active layer 12 there are deposited a drain electrode 14 and a source electrode 16 separately from each other and in ohmic contact to the active layer 12. These electrodes 14 and 16 are formed of, for example, Au-Ge-Au, Au-Ge-Ni or Au-Ge-Pt, which provide a stable ohmic contact to n-type III-V compound semiconductor material. If the active layer is of p-type, the drain and source electrodes can, for example, be formed of Au-Zn. Furthermore, first and second Schottky gate electrodes 18 and 20 are deposited on the active layer 12 between the drain and source electrodes 14 and 16, separately from each other and from the drain and source electrodes 14 and 16. These gate electrodes 18 and 20 are formed of, for example, Au-Ni, Ti-Pt-Au, Al, Pt or Pd.

With this construction, the second gate electrode 20 adjacent to the drain electrode 14 is electrically connected to the source electrode 16 through an interconnection conductor 22 formed on the substrate 10. This conductor 22 is formed, for example, by extending the second gate electrode 20 per se as shown in FIG. 5 so as to project onto the substrate 10 and to return back onto the source electrode 16. This interconnection between the second gate and the source is a first feature of the present invention.

In addition, a region 24A of the active layer 12 underneath the second gate electrode 20 is selectively doped with n-type impurities of the amount more than that of a region 24B of the active layer 12 underneath the first gate electrode 18, so that the region 24A involves a number of total carriers larger than the region 24B. This selective impurity doping to the region 24A can be made by various methods such as diffusion, ion implantation, etc. Thus, the active layer region 24A underneath the second gate electrode 20 has a sheet resistance smaller than that of the active layer region 24B underneath the first gate 18. This is the second feature of the present invention.

Figure 6:
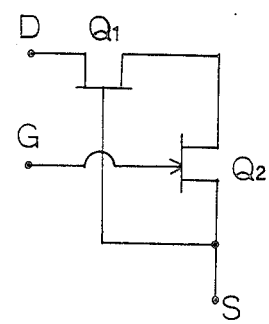
FIG. 6 is a circuit diagram of the MESFET shown in FIG. 5.

Turning to FIG. 6, there is shown a circuit diagram of the composite MESFET as mentioned above. As seen from Figure 6, the MESFET shown in FIG. 5 is composed of two MESFETs $Q_1$ and $Q_2$, one of which $Q_1$ has a source and a gate directly connected to a drain and a source of the other MESFET $Q_2$, respectively. In the circuit of FIG. 6, Reference Symbol D corresponds to the drain electrode 14, and Symbols S and G correspond to the source electrode 16 and the first gate electrode 18 adjacent to the source 16, respectively.

In the composite MESFET as mentioned above, firstly, the first Schottky gate 18 adjacent to the source 16, i.e., the signal gate G applied with an inputted signal is electrostatically shielded from the drain electrode 14 by means of the second Schottky gate electrode 20 which is adjacent to the drain electrode 14 and which is fixed to the same potential as that of the source electrode 16. Secondly, as seen from the circuit diagram shown in FIG. 6, since the two MESFETs $Q_1$ and $Q_2$ are cascade-connected, the feedback capacitance is greatly decreased. Because of the above two reasons, the capacitance $C_{gd}$ between the signal inputted gate G or 18 and the drain electrode 14 becomes a few-tenths or less of the conventional single-gate MESFET.

In this connection, even if the second Schottky gate electrode 20 has a gate length not greater than that of the first Schottky gate electrode 18, it is possible to sufficiently decrease the gate-drain capacitance $C_{gd}$.

Furthermore, the second Schottky gate electrode 20 adjacent to the drain electrode is connected to the source electrode 16 by means of the interconnection conductor 22 provided on the substrate, and therefore, parasitic inductances and capacitances attributable to the wiring for the interconnection are substantially negligible.

As the second important feature of the present invention, since the sheet resistance of the active layer region 24A underneath the second Schottky gate electrode 20 is sufficiently low, a low current loss MESFET $Q_1$ is constituted by the drain electrode 14, the second Schottky gate electrode 20 and an active layer region between the first and second gate electrodes 18 and 20, which region acts as a source region. Therefore, the dual-gate composite MESFET shown can have a current gain similar to the single-gate MESFET.

Because of the advantages mentioned above, the MESFET shown has good and stable operating characteristics in high speed operation and at high frequencies.

Figure 7:
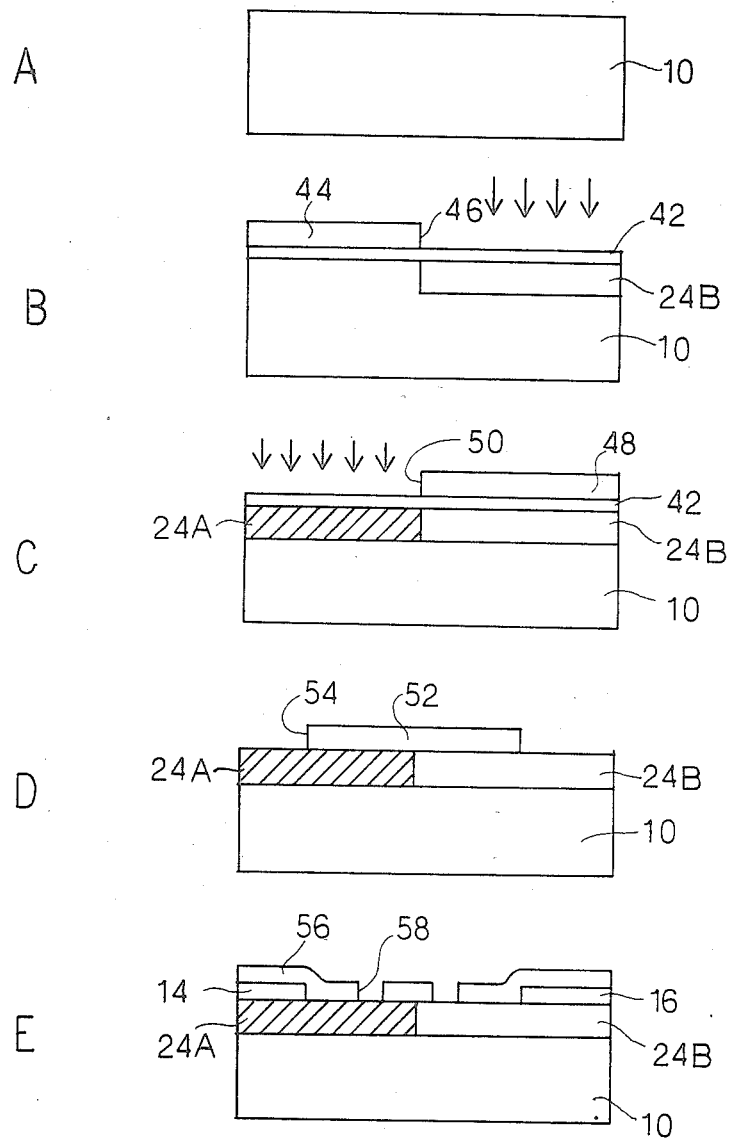
FIGS. 7A to 7E show one example of a process for manufacturing the MESFET shown in FIG. 5.

The aforementioned MESFET can be manufactured by, for example, the following process. Namely, there is prepared a non-doped semi-insulative GaAs single-crystal substrate 10 as the starting material, as shown in FIG. 7A. On the top surface of the substrate 10, a protecting coating 42 of for example $Si_3N_4$ having a thickness of 1000 Å is deposited and then masked by a photoresist pattern layer 44 having a window 46 at a location corresponding to the source 16 and the first gate electrode 18 (FIG. 7B). The coating 42 may be of other insulative materials such as $SiO_2$.

Through the mask 44, a first ion implantation with Si implants is carried out at 50 KeV with a dosage of $3.9 \times 10^{12}/cm^2$ to form an active layer region 24B having a threshold voltage of about 1.5 V. Thereafter, the mask 44 is removed and there is deposited another photoresist pattern layer 48 having an opening 50 at a location corresponding to the the drain 14 and the second gate electrode 20 (Figure 7C). Through the mask 48, a second ion implantation with Si implants is carried out at 50 KeV with a dosage of $5.0 \times 10^{12}/cm^2$ to form an active layer region 24A.

Then, the mask 48 and the protective coating 42 are removed, and then, the substrate 10 is annealed to activate the added impurities so as to form an n-type active layer 12. Thereafter, as shown in FIG. 7D, a third mask pattern 52 is deposited on the active layer 12 with windows 54 corresponding to positions to be formed with the drain and source electrodes 14 and 16, and electrode materials such as Au-Ge-Ni are deposited by, for example, an evaporation method. Then, a second annealing is executed to form ohmic contact between the deposited electrodes and the active layer.

The mask 52 is removed and there is furthermore deposited another mask 56 having windows 58 corresponding to the first and second electrodes 18 and 20 and the interconnection conductor 22, as shown in FIG. 7E. Then, an electrode material such as Al is deposited and the lift-off method is carried out, so that the first and second electrodes 18 and 20 having a gate length of 1.0 $\mu$m and a gate width of 100 $\mu$m and the interconnection conductor 22 are formed as shown in FIG. 5.

Thus, the composite MESFET having the threshold voltage of about 1.5 V has been fabricated. Measurement of a lot of MESFETs formed in accordance with the above method has indicated that the gate-drain capacitance $C_{gd}$ is decreased to a few tenths of the conventional single-gate MESFET. In addition, even if the gate width is changed in the range of 100 to 150 $\mu$m, similar results have been obtained.

Figure 8:
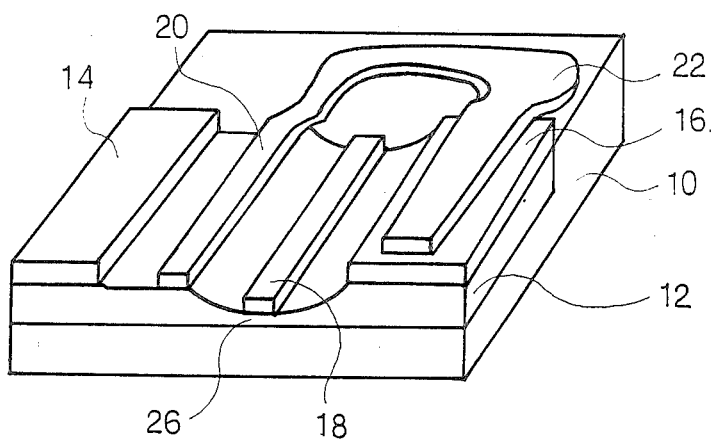
FIG. 8 is a view similar to FIG. 1 but showing a second embodiment of the MESFET constructed in accordance with the present invention.

Turning to FIG. 8, there is shown another embodiment of the MESFET in accordance with the present invention. Portions of this second embodiment similar to those of the first embodiment are given the same Reference Numerals, and explanation on those portions will be omitted.

In this MESFET, an active layer portion 26 underneath the first Schottky electrode 18 has a thickness smaller than the active layer portion underneath the second Schottky gate electrode 20. This thinner active layer portion 26 can be formed by, for example, so-called recess-etch process. Specifically, the thickness of the active layer portion 26 is adjusted to give a desired pinchoff voltage and at the same time to realize that the sheet resistance of the active layer underneath the second Schottky gate electrode 20 is smaller than that of the thin active layer portion 26 underneath the first Schottky gate electrode 18.

Furthermore, the internal connection of the composite MESFET shown in FIG. 8 is also represented by the circuit diagram shown in FIG. 6.

In the second embodiment shown in FIG. 8, therefore, the gate-drain capacitance $C_{gd}$ between the first gate electrode 18 and the drain 14 will be a few tenths or less of the conventional single-gate MESFET. In addition, similarly to the first embodiment in FIG. 5, the source electrode 16 and the second Schottky gate electrode 20 are interconnected by the internal conductor 22 which is formed on the substrate 10 and which gives only substantially negligible parasitic inductance and capacitance. Therefore, the MESFET is free from parasitic inductance and capacitance caused by an external circuit.

Furthermore, a sufficiently small sheet resistance of the active layer underneath the second gate electrode 20 makes it possible to have a current gain compatible with the single-gate MESFET.

In the case that the MESFET as shown in FIG. 8 is actually manufactured, if the active layer 26 underneath the first gate electrode 18 is formed to have a threshold voltage of about 1.5 V, the active layer underneath the second electrode 20 is preferably made 20% thicker than the active layer portion 26.

Figure 9:
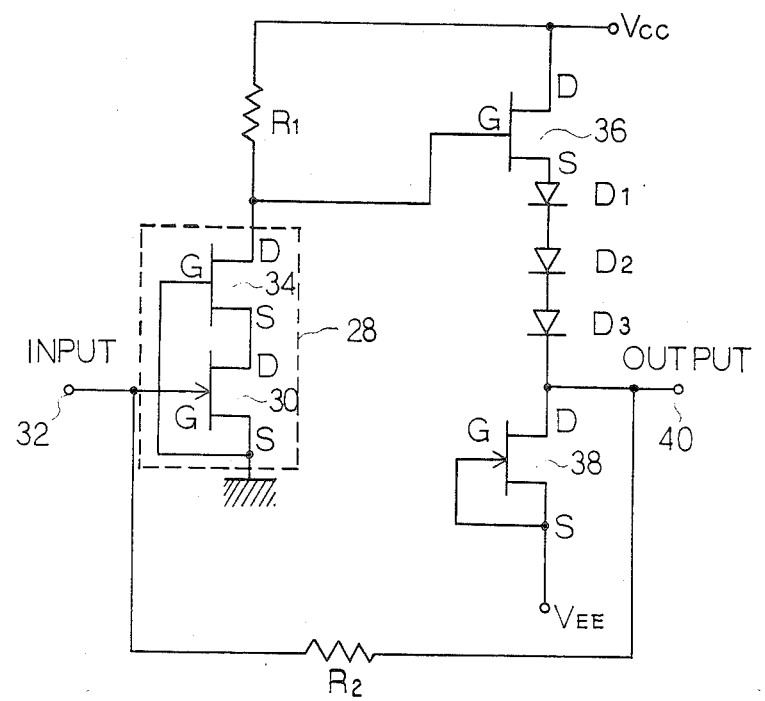
FIG. 9 is a circuit diagram showing an example of an amplifier using the MESFET in accordance with the present invention.

Referring to FIG. 9, there is shown a circuit diagram of an amplifier using MESFETs constructed in accordance with the present invention. The shown amplifier comprises a source-grounded amplifier stage and a level shifting source follower stage. The amplifier stage includes a composite MESFET 28 in accordance with the present invention which comprises an FET 30 having a gate connected to an input 32 and a source and a drain connected to a gate and source of a second FET 34, respectively. The source of the FET 30 is grounded, and the drain of the FET 34 is connected through a load resistor R1 to a positive voltage $V_{CC}$. The connection node between the resistor R1 and the FET 34 is connected to a gate of a third FET 36 which constitutes a portion of the level shift stage. The FET 36 has a drain connected through three diodes D1, D2 and D3 to a drain of a fourth FET 38 and an output 40. Gate and source of the FET 38 are connected to each other so as to form an active load and also connected to a biasing voltage $V_{EE}$. In addition, the output 40 is connected to the input 32 through a feedback resistor R2.

Here, examining the cutoff frequency $f_c$ at the connection node between the resistor R1 and the FET 34, it can be expressed:

$$f_c = g_m/C_{in})^n \text{ where } n=1-2 \quad (1)$$

In addition, the input capacitance $C_{in}$ can be expressed:
$$C_{in} = C_{gs} + 2C_{gd} \quad (3)$$

As mentioned hereinbefore, since the feedback capacitance effect is very small in the composite MESFET in accordance with the present invention, the above equation (3) for the input capacitance has the second item of $2C_{gd}$ independently of the voltage gain, and differently from the equation (2) $C_{in} = C_{gs} + (1-G) C_{gd}$ for the conventional single-gate MESFET. In addition, since the gate-drain capacitance $C_{gd}$ itself in the present MESFET is very small, i.e., a few tenths of the conventional single-gate MESFET, the $2C_{gd}$ is a very small constant value, and so, the input capacitance $C_{in}$ becomes a value greatly smaller than that of the conventional single-gate MESFET. Therefore, the cutoff frequency $f_c$ is greatly improved. In other words, as mentioned hereinbefore, by applying the present invention to the MESFET having a cutoff frequency of 1.2 GHz, the cutoff frequency could have been improved to about 3.2 GHz.

As is apparent from the above explanation with reference to the accompanying drawings, the MESFET in accordance with the present invention has a gate-drain capacitance which is decreased in the current gain. Therefore, the MESFET can stably operate at very high speeds and at very high frequencies.

Accordingly, the MESFETs of the present invention can be effectively used in active circuits such as amplifiers, logical circuits, source follower circuits and level shift circuits in which the gate-drain capacitance $C_{gd}$ causes a significant problem in operation.

In addition, since the MESFETs of the present invention need no external circuit, they can be not only realized as discrete circuit elements but also assembled in integrated circuit chips. In such cases, since no external circuit is needed, the MESFETs can be fabricated and packaged by conventional methods, so that the MESFETs can be easily manufactured at a good yield. This is a large industrial value.

The invention has thus been shown and described with reference to specific embodiments. However, it should be noted that the invention is in no way limited to the details of the illustrated structures but changes and modifications may be made within the scope of the appended claims.

I claim:

1. A Schottky-gate planar type field effect transistor comprising a semi-insulative semiconductor substrate, an active layer of impurity doped semiconductor material formed to cover at least a portion of one principal surface of the substrate, a source electrode and a drain electrode on a surface of the active layer in ohmic contact thereto and separated from each other, a first Schottky gate electrode on the same surface of the active layer between the source and drain electrodes and separated from the source and drain electrodes, and a second Schottky gate electrode on the same surface of the active layer between the drain electrode and the first gate electrode and separated from the drain electrode and the first gate electrode, a portion of the active layer underneath the second gate electrode having a sheet resistance smaller than that of an active layer portion underneath the first gate electrode, and the source electrode and the second gate electrode being electrically interconnected by a conductor located on the one principal surface side of the substrate.

2. A field effect transistor as claimed in claim 1 wherein the active layer portion underneath the second gate electode has an impurity concentration higher than that of the active layer portion underneat the first gate electrode.

3. A field effect transistor as claimed in claim 2 wherein the active layer portion underneath the first gate electrode is doped with impurities so as to have a threshold voltage of about 1.5 V, and the active layer portion underneath the second gate electrode has an impurity concentration larger than that of the active layer portion underneath the first gate electrode by about 20%.

4. A field effect transistor as claimed in claim 3 wherein the active layer portion underneath the first gate electrode has an impurity concentration of $3.9 \times 10^{12}/cm^2$ and the active layer portion underneath the second gate electrode has an impurity concentration of $5.0 \times 10^{12}/cm^2$.

5. A field effect transistor as claimed in claim 4 wherein the substrate and the active layer are made from a III-V compound semiconductor material.

6. A field effect transistor as claimed in claim 5 wherein the substrate is made from GaAs and the active layer is doped with n-type impurities.

7. A field effect transistor as claimed in claim 1 wherein the active layer portion underneath the first gate electrode has a thickness smaller than that of the active layer portion underneath the second gate electrode.

8. A field effect transistor as claimed in claim 7 wherein the active layer portion underneath the first gate electrode has a threshold voltage of about 1.5 V and the active layer portion underneath the second gate electrode is thicker than that of the active layer portion underneath the first gate electrode by about 20%.

9. A field effect transistor as claimed in claim 8 wherein the substrate and the active layer are made from a III-V compound semiconductor material.

10. A field effect transistor as claimed in claim 9 wherein the substrate is made from GaAs and the active layer is doped with n-type impurities.

* * * * *

UNITED STATES PATENT AND TRADEMARK OFFICE
CERTIFICATE OF CORRECTION

PATENT NO. : 4,709,251

DATED : November 24, 1987

INVENTOR(S) : Tomihiro Suzuki

It is certified that error appears in the above-identified patent and that said Letters Patent is hereby corrected as shown below:

Col. 1, line 25, change "an" to --and--.
Col. 1, line 65, change "n = 1-2 to --n = 1~2--; and move "(1)" to end of line.
Col. 2, line 6, change "looking" to --Looking--.
Col. 2, line 34, change "reducng" to --reducing--.
Col. 7, line 49, after "drain" insert --connected to the positive voltage $V_{CC}$ and a source--
Col. 7, line 60, after "f =" insert --(--; and change "1-2" to --1~2--.
Col. 8, line 18, after "decreased" insert --to a few tenths of the conventional MESFET without decrease--.
Col. 8, line 65, change "underneat" to --underneath--.

Signed and Sealed this

Thirtieth Day of August, 1988

Attest:

DONALD J. QUIGG

Attesting Officer

Commissioner of Patents and Trademarks